United States Patent
Zhang et al.

(10) Patent No.: US 11,929,448 B2
(45) Date of Patent: Mar. 12, 2024

(54) ELECTRIC INJECTION ANNEALING TEST DEVICE AND A METHOD THEREOF FOR CRYSTALLINE SILICON PHOTOVOLTAIC SOLAR CELLS

(71) Applicant: South China University of Technology, Guangdong (CN)

(72) Inventors: Xianmin Zhang, Guangzhou (CN); Linlin Cai, Guangzhou (CN); Shenghui Bai, Guangzhou (CN)

(73) Assignee: South China University of Technology, Guangdong (CN)

( * ) Notice: Subject to any disclaimer, the term of this patent is extended or adjusted under 35 U.S.C. 154(b) by 600 days.

(21) Appl. No.: 17/254,308

(22) PCT Filed: Oct. 22, 2018

(86) PCT No.: PCT/CN2018/111207
§ 371 (c)(1),
(2) Date: Dec. 21, 2020

(87) PCT Pub. No.: WO2020/000793
PCT Pub. Date: Jan. 2, 2020

(65) Prior Publication Data
US 2021/0119074 A1    Apr. 22, 2021

(30) Foreign Application Priority Data

Jun. 28, 2018 (CN) .......................... 201810683547.4

(51) Int. Cl.
*H02S 50/15*     (2014.01)
*H01L 21/66*     (2006.01)
*H01L 31/18*     (2006.01)

(52) U.S. Cl.
CPC .......... *H01L 31/1864* (2013.01); *H01L 22/30* (2013.01); *H02S 50/15* (2014.12)

(58) Field of Classification Search
CPC ..... H01L 22/20; H01L 22/30; H01L 31/1864; H01L 22/14; H01L 2924/12042;
(Continued)

(56) References Cited

U.S. PATENT DOCUMENTS 7,709,794 B2 * 5/2010 Zhao ...................... G01N 25/72
250/334
7,847,237 B2 * 12/2010 Fuyuki .................... H02S 50/10
250/214 R
(Continued)

FOREIGN PATENT DOCUMENTS

CN    202210079    5/2012
CN    106301222    1/2017
(Continued)

*Primary Examiner* — Vinh P Nguyen
(74) *Attorney, Agent, or Firm* — JMB Davis Ben-David

(57) ABSTRACT

Described herein is an electric injection annealing test device for crystalline silicon photovoltaic solar cells, the test device comprises a dark box, a sample test bench, a temperature control device, a power supply device and an image acquisition device. The sample test bench, the temperature control device, the power supply device and the image acquisition device are located in the dark box; the sample test bench is used to place a solar cell sheet; the temperature control device is used to control a temperature of the solar cell sheet; the power supply device provides a current to the solar cell sheet, the image acquisition device is used to acquire electroluminescence images of the solar cell sheet under different temperatures and current conditions.

9 Claims, 2 Drawing Sheets

(58) Field of Classification Search
CPC ............... H01L 31/02327; H01L 33/06; H01L 21/823885; H01L 27/14636; H01L 2933/005; H01L 27/14643; H01L 25/167; H01L 21/823475; H01L 31/02008; H01L 31/022425; H02S 50/10; H02S 50/15; Y02E 10/50; Y02E 10/544; Y02E 10/543; G02F 1/133614; G01R 15/241; G01R 31/311

See application file for complete search history.

(56) References Cited

U.S. PATENT DOCUMENTS

| | | | | |
|---|---|---|---|---|
| 8,355,563 | B2* | 1/2013 | Kasahara | ................ H02S 50/10 |
| | | | | 382/141 |
| 9,863,890 | B2* | 1/2018 | Jungwirth | .......... G01N 21/9501 |
| 10,554,172 | B2* | 2/2020 | Deceglie | ............ G01N 21/9501 |
| 10,734,945 | B1* | 8/2020 | Kim | ...................... H01L 31/048 |

FOREIGN PATENT DOCUMENTS

| | | |
|---|---|---|
| CN | 107464858 | 12/2017 |
| CN | 207116458 | 3/2018 |
| CN | 208368532 | 1/2019 |
| JP | 2014228517 | 12/2014 |

* cited by examiner

ELECTRIC INJECTION ANNEALING TEST DEVICE AND A METHOD THEREOF FOR CRYSTALLINE SILICON PHOTOVOLTAIC SOLAR CELLS

CROSS-REFERENCE TO RELATED APPLICATIONS

This is the U.S. National Stage of International Patent Application No. PCT/CN2018/111207 filed on Oct. 22, 2018, which in turn claims the benefit of Chinese Patent Application No. 201810683547.4 filed on Jun. 28, 2018.

TECHNICAL FIELD

The invention relates to the field of manufacturing of solar cell sheets, in particular to an electric injection annealing test device and a method thereof for crystalline silicon photovoltaic solar cells.

TECHNICAL BACKGROUND

As a clean and renewable energy source, the use of solar energy has always been paid attention to. Crystalline silicon solar cells are currently the main product in the photovoltaic market, but the problem of light-induced degradation (LID) has greatly limited its large-scale mass production applications. The initial light-induced degradation of photovoltaic modules on the market is caused by the initial light-induced degradation of the cells, so the cell sheets need to be treated for anti-light-induced degradation. Passivating corresponding defects and impurities is an effective way to suppress light-induced degradation. The main mechanism is: light or electric injection changes the carrier concentration to induce the formation of recombination centers, and at the same time changes the quasi-Fermi level of electrons to promote the corresponding elements to passivate the recombination center. In order to realize this injection method, the current anti-LID technology for crystalline silicon photovoltaic solar cells is mainly realized by a photo-thermal furnaces and electric injection annealing furnaces.

The light injection annealing equipment used in the prior art is mainly a tunnel structure. A light source (halogen lamp/LED/laser) is installed in the tunnel. When the cell sheets pass through the tunnel, the light and heat technology of the light source is used to heat the cell sheets to a certain temperature. In this way, the anti-LID treatment of the cell sheets can be achieved, which can effectively suppress the light-induced degradation of monocrystalline passivated emitter rear contact (PERC) cells, and the degradation result of the conversion efficiency is reduced from 3% to 5% to within 1.5%. However, in actual test, it was found that the output of the cell sheets was not stable after the treatment for light degradation, and there was still a larger degradation. At the same time, the power consumption was large and the cost was high. Therefore, it was proposed to adopt the method of electric injection annealing to perform the anti-light degradation treatment, which can well reduce the cost and ensure the stability of the cells.

Due to the complexity of defects and impurities of crystalline silicon photovoltaic solar cells, the required temperature and external voltage for each type of recombination center are different. Once the corresponding temperature is exceeded or an external voltage is applied, the recombination centers that have lost their activity will be activated. It is difficult for a single injection method to effectively passivate all recombination centers. For multiple degradation mechanisms, there will be multiple sub-stages for polycrystalline processing, requiring longer processing times. Therefore, in order to more effectively passivate defects, to know the type of main defects of solar cell sheets and their processing conditions, it is necessary to understand the effect of temperature and current in the process of defect passivation and activation.

SUMMARY OF THE INVENTION

The purpose of the present invention is to overcome the defects and deficiencies of the prior art, and to provide an electric injection annealing test device for crystalline silicon photovoltaic solar cells. The device can provide stable temperature and current, and obtain electroluminescence images of solar cell sheets under different temperature and current conditions. It is convenient to view the whole process of excitation defects and passivation defects of the cell sheets. The structure is simple, and the test is convenient.

Another object of the present invention is to provide a method for electrical injection annealing test for crystalline silicon photovoltaic solar cells. The method obtains the degradation rate and regeneration rate of solar cell sheet under different temperature and current conditions respectively. Through data analysis, the effect of temperature and current on the degradation rate and regeneration rate of solar cell sheet can be obtained.

The object of the present invention can be achieved by the following technical solutions:

An electric injection annealing test device for crystalline silicon photovoltaic solar cells, the test device comprises a dark box, a sample test bench, a temperature control device, a power supply device and an image acquisition device; the sample test bench, the temperature control device, the power supply device and the image acquisition device are located in the dark box; the sample test bench is used to place a solar cell sheet; the temperature control device is used to control a temperature of the solar cell sheet; the power supply device provides a current to the solar cell sheet, the image acquisition device is used to acquire electroluminescence images of the solar cell sheet under different temperatures and current conditions.

As a preferred embodiment, the dark box comprises a nitrogen gas injection terminal and an air exhaust terminal. Nitrogen can be injected from the nitrogen injection terminal. Nitrogen prevents the solar cell sheet from being oxidized during the electrical injection annealing test.

As a preferred embodiment, the sample test bench comprises an upper probe fixing frame, an upper probe row, a lower probe fixing frame and a lower probe row; the upper probe fixing frame fixes the upper probe row, and the lower probe fixing frame fixes the lower probe row.

As a preferred embodiment, the temperature control device comprises a constant temperature heating platform, a temperature sensor, a temperature control switch and a fan; the constant temperature heating platform is placed under the sample test bench; the temperature sensor is connected to the solar cell sheet, the fan is installed at an air exhaust terminal of the dark box; a temperature control switch is used to control an on-off electricity of the fan.

As a preferred embodiment, the power supply device is a constant current source. The constant current source can provide a stable current for the solar cell sheet.

As a preferred embodiment, the image acquisition device comprises a camera, a camera holder, a camera fixing block and a slider; the camera is fixed on the camera holder through the camera fixing block; the camera slides on the camera holder through the slider.

Another object of the present invention can be achieved by the following technical solutions:

An electric injection annealing test method for crystalline silicon photovoltaic solar cell sheet, the method comprises the following steps:

turning on a temperature control device to keep a solar cell sheet at a constant temperature T;

placing the solar cell sheet on a sample test bench; connecting an electric circuit, injecting a current I into the solar cell sheet; and obtaining an initial electroluminescence image of the solar cell sheet;

maintaining the temperature T and current I unchanged, obtaining an electroluminescence image every time after a period of time until dark areas in electroluminescence images remain unchanged;

estimating a degradation time $t_{deg}$ and a regeneration time $t_{re}$ through analyzing changes of the dark areas in the electroluminescence images with respect to time to obtain a corresponding degradation rate $R_{deg}$ and a regeneration rate $R_{re}$;

changing the temperature or the current, repeating the above steps to obtain long-term electroluminescence images of the crystalline silicon photovoltaic cells under different electrical injection annealing conditions to analyze the degradation rate $R_{deg}$ and the regeneration rate $R_{re}$ under different electrical injection annealing conditions;

based on the degradation rate $R_{deg}$ and the regeneration rate $R_{re}$ under the different electrical injection annealing conditions, analyzing effects of the temperature and the current on the degradation rate $R_{deg}$ and regeneration rate $R_{re}$.

As a preferred embodiment, a range of the temperature T is 30 to 100° C., a range of the current I is 0.1 A to 15 A, a range of an interval of photographing is 1 to 10 minutes.

As a preferred embodiment, an effect of the temperature on the degradation rate $R_{deg}$ and the regeneration rate $R_{re}$ according to the electric injection annealing test method can be fitted to the following equation:

$$\ln R_{deg} = \ln A - \frac{E_a}{k_b T} \text{ and } \ln R_{re} = \ln A - \frac{E_a}{k_b T},$$

where T is the temperature, $E_a$ is a reaction activation energy, $k_g = 1.38 \times 10^{-23}$ J/K, A is the frequency factor.

As a preferred embodiment, an effect of the current on the degradation rate $R_{deg}$ and the regeneration rate $R_{re}$ according to the electric injection annealing test method can be fitted to the following equation:

$$\frac{1}{R_{deg}} = a \times I + b \text{ and } \frac{1}{R_{re}} = a \times I + b,$$

where I is the current, a and b are influence factors.

Compared with the prior art, the present invention has the following advantages and beneficial effects:

1. The test device of the present invention is a test device that combines the electroluminescence detection and the electric injection annealing of solar cell sheets, and can perform the electroluminescence detection during the electric injection annealing test. It reduces the detection time and reduces energy consumption of tests.

2. The temperature control device used in the present invention can control the on-off of the fan according to the detected temperature of the solar cell sheets, thereby adjusting the temperature of the solar cell sheets, increasing the cooling rate, maintaining the test environment at a constant temperature, and effectively ensuring stability of solar cell sheet degradation and regeneration under different electrical injection annealing conditions.

3. The invention obtains electroluminescence images under different temperature and current conditions in different time periods, and performs chemical kinetic analysis to study the effect of temperature and current on the degradation and regeneration stages of solar cell sheet, which can provide a basis for multi-stage annealing treatment.

Brief description of the figures: 1: computer, 2: lower probe fixing frame, 3: lower probe row, 4: solar cell sheet, 5: carrier frame, 6: slider, 7: camera holder, 8: camera fixing block, 9: camera, 10: upper probe row, 11: upper probe fixing frame, 12: temperature sensor, 13: temperature control switch, 14: constant temperature heating platform, 15: constant current source, 16: nitrogen gas injection terminal, 17: dark box, 18: air exhaust terminal, 19: fan

DESCRIPTION

The present invention will be described in further detail below with reference to examples and drawings, but the embodiments of the present invention are not limited thereto.

Figure 1:
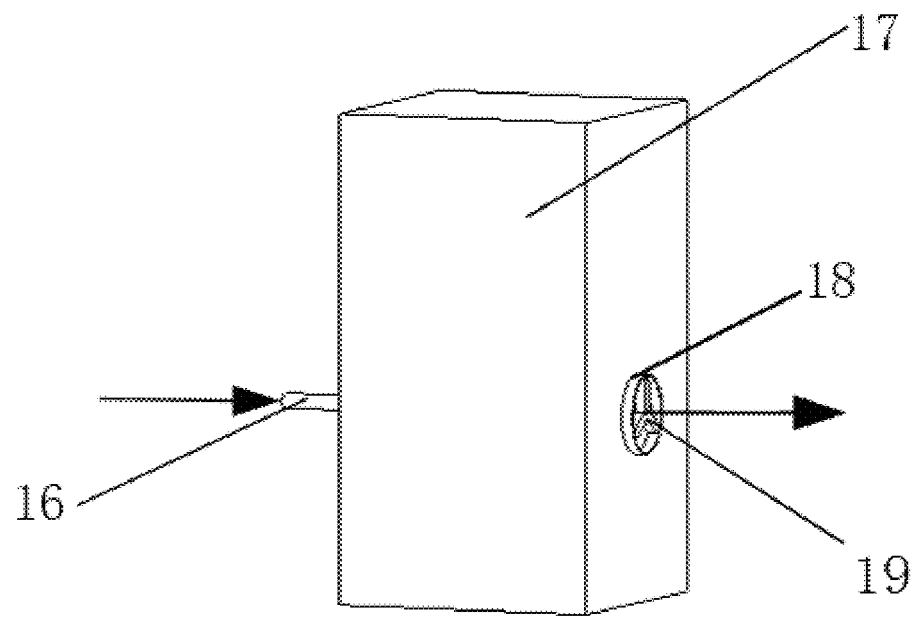
FIG. 1 is a structural diagram of a dark box in an embodiment of the present invention.
Figure 2:
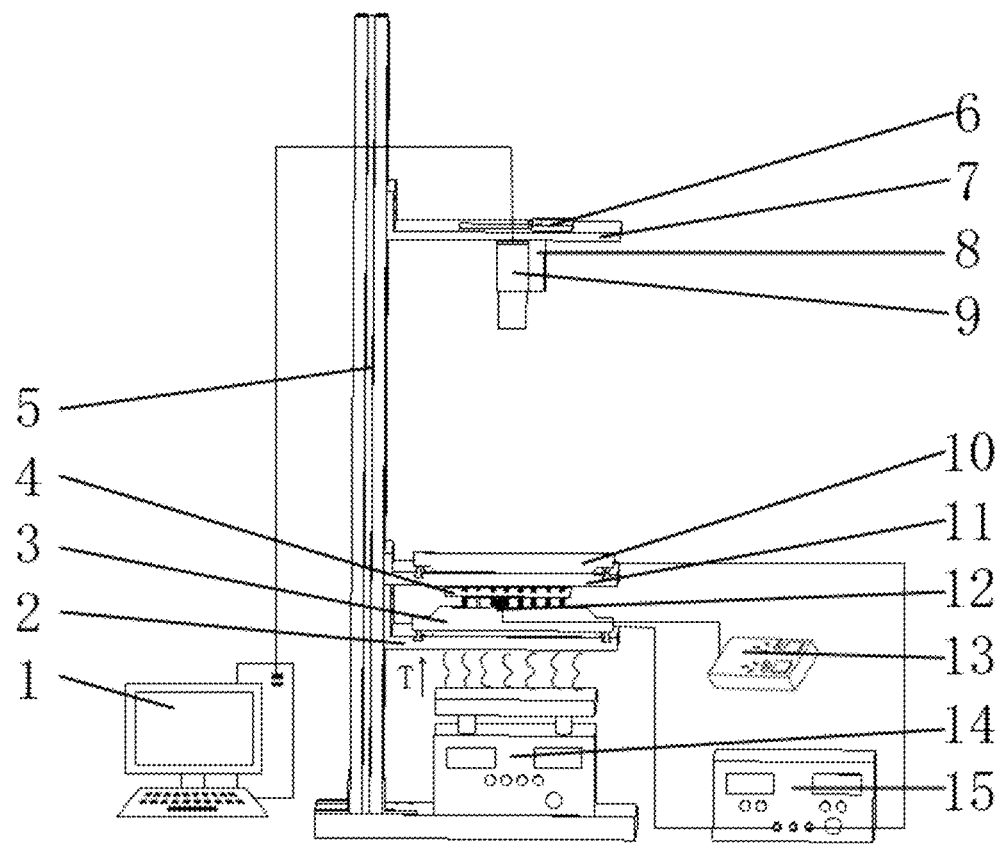
FIG. 2 is a structural view of a sample test bench, a temperature control device, a power supply device, and an image acquisition device placed in a dark box in an embodiment of the present invention.
Figure 3:
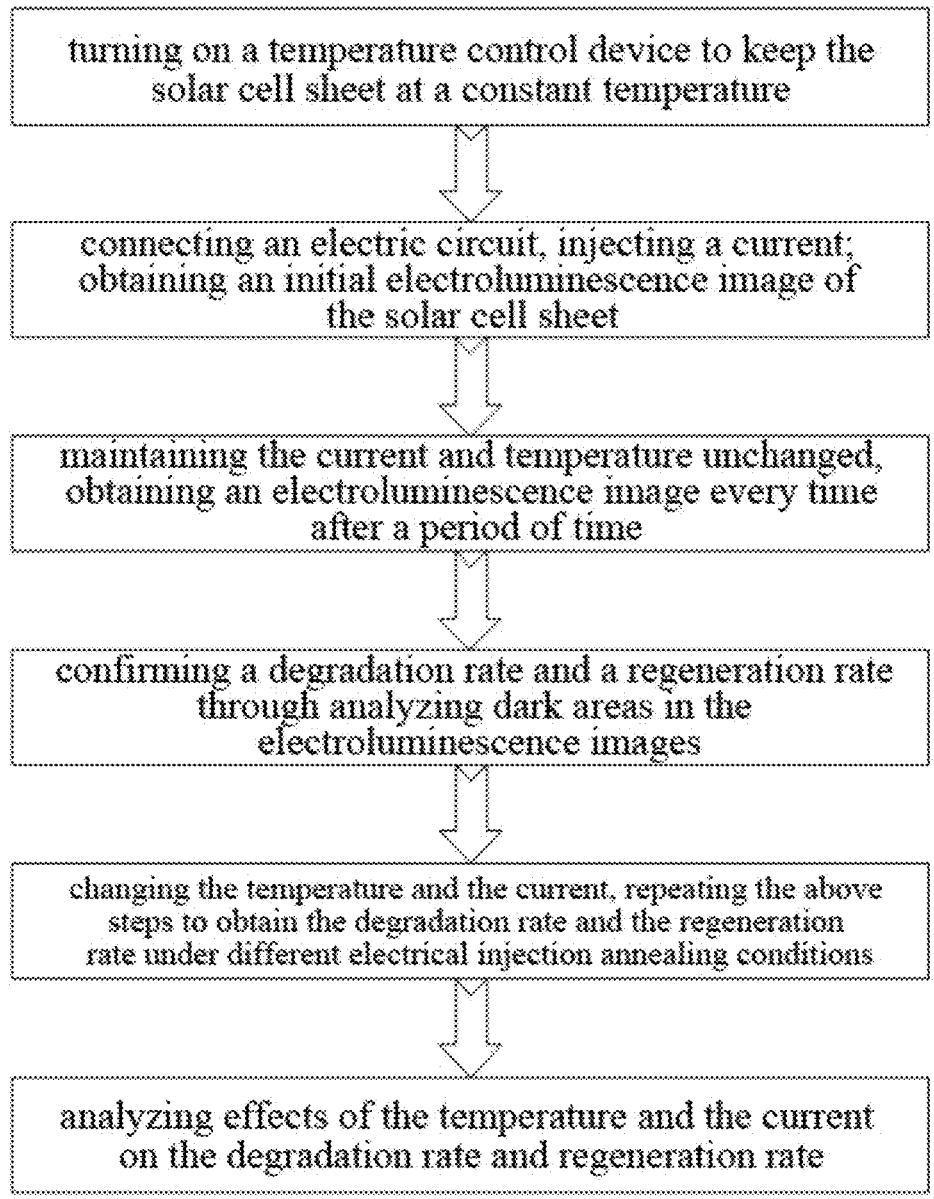
FIG. 3 is a flow chart of the electric injection annealing test method for the crystalline silicon photovoltaic solar cell in the embodiment of the present invention.

As shown in FIGS. 1 and 2, the embodiments of the present invention provide an electric injection annealing test device for crystalline silicon photovoltaic solar cells. The test device comprises a dark box 17, a sample test bench, a temperature control device, a power supply device and an image acquisition device. The sample test bench, the temperature control device, the power supply device and the image acquisition device are located in the dark box 17. The dark box 17 is a rectangular structure. A nitrogen gas injection terminal 16 is provided on one side of the dark box, and an air exhaust terminal 18 is provided on the other symmetrical side. Nitrogen can be injected from the nitrogen gas injection terminal 16 to prevent the solar cell sheet from being oxidized during the electrical injection annealing test. The dark box 17 is opaque, so the electroluminescence images taken have better definition and higher accuracy.

The sample test bench comprises an upper probe fixing frame 11, an upper probe row 10, a lower probe fixing frame 2 and a lower probe row 3; the upper probe fixing frame 11 fixes the upper probe row 10, and the lower probe fixing frame 2 fixes the lower probe row 3. A solar cell sheet 4 is placed on the sample test bench, and each probe of the upper probe row 10 and the lower probe row 3 is in precise contact with the main grid of the solar cell sheet 4 to ensure that the crystalline solar cell sheet 4 is energized.

The temperature control device comprises a constant temperature heating platform 14, a temperature sensor 12, a temperature control switch 13 and a fan 19. The constant temperature heating platform 14 is placed under the sample test bench. The constant temperature heating platform 14 can be adjusted up to 450° C. The temperature sensor 12 is a thermocouple temperature sensor and is connected to the solar cell sheet 4. The fan 19 is installed at the air exhaust terminal 18 of the dark box 17. The temperature control switch 13 is used to control the power of the fan 19. The temperature sensor 12 transmits the temperature of the solar cell to the temperature control switch 13, and control the on-off electricity of the fan 19 through the temperature control switch 13 to maintain the constant temperature of the solar cell sheet.

The power supply device is a constant current source 15. The constant current source 15 is connected to the upper probe row 10 and the lower probe row 3 through a high temperature resistant cable. The upper probe row 10 and the lower probe row 3 are in precise contact with the main grid of the solar cell sheet 4 to ensure that the current can conduct the solar cell sheet 4.

The image acquisition device comprises a camera 9, a camera holder 7, a camera fixing block 8 and a slider 6. The camera 9 is a near range infrared camera. The camera 9 is fixed on the camera holder 8 through the camera fixing block 7, and slides on the camera holder 7 through the slider 6. The camera 9 is used to acquire electroluminescence images, and analyze the influence of the effect of current and temperature on the degradation rate and regeneration rate through the changes of dark areas in the electroluminescence images. The image acquisition device and the sample test bench are installed on the carrier frame 5. The carrier frame 5 is made of aluminum alloy material.

An embodiment of the present invention also provides a method for electrical injection annealing testing for crystalline silicon photovoltaic solar cells. The method comprises the following steps:

Turning on a temperature control device to keep a solar cell sheet at a constant temperature T. T is 50° C.

Placing a main grid of the solar cell sheet into good contact with the upper probe row 10 and the lower probe row 3, connecting the circuit, injecting current I into the solar cell sheet, I is 10 A, and obtaining an initial electroluminescence image of the solar cell sheet.

Maintaining the temperature T and current I unchanged, obtaining an electroluminescence image every time after a period of time (5 minutes) until dark areas in electroluminescence images remain unchanged.

Estimating a degradation time $t_{deg}$ and a regeneration time $t_{re}$ through analyzing changes of the dark areas in the electroluminescence images with respect to time to obtain a corresponding degradation rate $$R_{deg} = \frac{1}{t_{deg}}$$

and a regeneration rate $$R_{re} = \frac{1}{t_{re}}.$$

For example, the electroluminescence images corresponding to the time of 0 h, 4 h, 10 h, 27 h, 45 h, 66 h, 90 h and 140 h are selected according to the experiment to analyze the changes of the dark area. (A) From 0 h to 10 h, it can be seen that the entire electroluminescence images becoming darker and more uniform. There are a few areas where the darkness is more obvious, the degradation is stable, and the degradation rate is small; (B) the time period from 10 h to 27 h, the dark areas in the image become even more uniform. There are almost no prominent areas. There is no large fluctuation in the degradation rate; (C) however, after 45 h, there are obvious local dark blocks in many places in the image, forming a sharp contrast. The degradation suddenly changes, and the degradation rate increases sharply; (D) from 66 h to 90 h, the dark blocks is disappearing, slowly moving to the central area, and is in a dynamic balance of degradation and regeneration. The degradation is decreasing on the whole and the regeneration rate is increasing; (E) from the last 90 h to 140 h, the degradation gradually disappears, with regeneration as the main thing. The regeneration rate is relatively stable. Compared with the original image, the final image still has few dark marks, but those can be ignored.

Changing the temperature or the current, repeating the above steps to obtain long-term electroluminescence images of the crystalline silicon photovoltaic cells under different electrical injection annealing conditions to analyze the degradation rate $R_{deg}$ and the regeneration rate $R_{re}$ under different electrical injection annealing conditions.

Based on the degradation rate $R_{deg}$ and the regeneration rate $R_{re}$ under the different electrical injection annealing conditions, analyzing effects of the temperature and the current on the degradation rate $R_{deg}$ and regeneration rate $R_{re}$.

The solar cell sheet 4 may be a B-doped, Ga-doped, Ge-doped monocrystalline silicon cell sheet or a polycrystalline silicon cell sheet. It is best to select solar cell sheet from the same manufacturer with the same specifications to ensure the stability of the test results. A range of the temperature T is 30 to 100° C. A range of the current I is 0.1 A to 15 A. A range of an interval of photographing is 1 to 10 minutes.

After many tests, the effect of temperature on the degradation rate $R_{deg}$ and regeneration rate $R_{re}$ can be fitted to the following equation:

$$\ln R_{deg} = \ln A - \frac{E_a}{k_B T} \text{ and } \ln R_{re} = \ln A - \frac{E_a}{k_B T},$$

where T is the temperature, $E_a$ is a reaction activation energy, $E_a$=0.5921; $-k_B$=1.38×10$^{-23}$ J/K, A is the frequency factor, A=1.42×10$^{-8}$.

After many tests, the effect of current on the degradation rate $R_{deg}$ and regeneration rate $R_{re}$ can be fitted to the following equation:

$$\frac{1}{R_{deg}} = a \times I + b \text{ and } \frac{1}{R_{re}} = a \times I + b,$$

where I is the current, a and b are influence factors, a=−3.11, b=67.

The above examples only express several embodiments of the present invention, and their descriptions are more specific and detailed, but they should not be construed as limits of the patent scope of the present invention. It should be noted that, those of ordinary skill in the art, without departing from the concept of the present invention, can also make several modifications and improvements, which all fall within the protection scope of the present invention. Therefore, the protection scope of the invention patent shall be subject to the appended claims.

The invention claimed is:

1. An electric injection annealing test device for crystalline silicon photovoltaic solar cells, characterized in that, the test device comprises a dark box, a sample test bench, a temperature control device, a power supply device and an image acquisition device; the sample test bench, the temperature control device, the power supply device and the image acquisition device are located in the dark box; the sample test bench is used to place a solar cell sheet; the temperature control device is used to control a temperature of the solar cell sheet; the power supply device provides a current to the solar cell sheet, the image acquisition device is used to acquire electroluminescence images of the solar cell sheet under different temperatures and current conditions; wherein the image acquisition device comprises a camera, a camera holder, a camera fixing block and a slider; the camera is fixed on the camera holder through the camera fixing block; the camera slides on the camera holder through the slider.

2. The electric injection annealing test device for crystalline silicon photovoltaic solar cells according to claim 1, characterized in that, the dark box comprises a nitrogen gas injection terminal configured to allow nitrogen to be injected therefrom to prevent the solar cell sheet placed on the from sample test bench being oxidized during a electrical injection annealing test.

3. The electric injection annealing test device for crystalline silicon photovoltaic solar cells according to claim 1, characterized in that, the sample test bench comprises an upper probe fixing frame, an upper probe row, a lower probe fixing frame and a lower probe row; the upper probe fixing frame fixes the upper probe row, and the lower probe fixing frame fixes the lower probe row.

4. The electric injection annealing test device for crystalline silicon photovoltaic solar cells according to claim 1, characterized in that, the temperature control device comprises a constant temperature heating platform, a temperature sensor, a temperature control switch and a fan; the constant temperature heating platform is placed under the sample test bench; the temperature sensor is connected to the solar cell sheet, the fan is installed at an air exhaust terminal of the dark box; a temperature control switch is used to control an on-off electricity of the fan.

5. The electric injection annealing test device for crystalline silicon photovoltaic solar cells according to claim 1, characterized in that, the power supply device is a constant current source.

6. An electric injection annealing test method for crystalline silicon photovoltaic solar cells, characterized in that, the method comprises the following steps:

turning on a temperature control device to keep a solar cell sheet at a constant temperature T;

placing the solar cell sheet on a sample test bench; connecting an electric circuit, injecting a current I into the solar cell sheet; and obtaining an initial electroluminescence image of the solar cell sheet;

maintaining the temperature T and current I unchanged, obtaining an electroluminescence image every time after a period of time until dark areas in electroluminescence images remain unchanged;

estimating a degradation time $t_{deg}$ and a regeneration time $t_{re}$ through analyzing changes of the dark areas in the electroluminescence images with respect to time to obtain a corresponding degradation rate $R_{deg}$ and a regeneration rate $R_{re}$;

changing the temperature or the current, repeating the above steps to obtain long-term electroluminescence images of the crystalline silicon photovoltaic cells under different electrical injection annealing conditions to analyze the degradation rate $R_{deg}$ and the regeneration rate $R_{re}$ under different electrical injection annealing conditions;

based on the degradation rate $R_{deg}$ and the regeneration rate $R_{re}$ under the different electrical injection annealing conditions, analyzing effects of the temperature and the current on the degradation rate $R_{deg}$ and regeneration rate $R_{re}$.

7. The electric injection annealing test method for crystalline silicon photovoltaic solar cells according to claim 6, characterized in that, a range of the temperature T is 30 to 100° C., a range of the current I is 0.1 A to 15 A, a range of an interval of photographing is 1 to 10 minutes.

8. The electric injection annealing test method for crystalline silicon photovoltaic solar cells according to claim 6, characterized in that, an effect of the temperature on the degradation rate $R_{deg}$ and the regeneration rate $R_{re}$ according to the electric injection annealing test method can be fitted to the following equation:

$$\ln R_{deg} = \ln A - \frac{E_a}{k_B T} \text{ and } \ln R_{re} = \ln A - \frac{E_a}{k_B T},$$

where T is the temperature, $E_a$ is a reaction activation energy, $k_B$=1.38×10$^{-23}$ J/K, A is the frequency factor.

9. The electric injection annealing test method for crystalline silicon photovoltaic solar cells according to claim 6, characterized in that, an effect of the current on the degradation rate $R_{deg}$ and the regeneration rate $R_{re}$ according to the electric injection annealing test method can be fitted to the following equation:

$$\frac{1}{R_{deg}} = a \times I + b \text{ and } \frac{1}{R_{re}} = a \times I + b,$$

where I is the current, a and b are influence factors.

* * * * *